(12) United States Patent
Willer et al.

(10) Patent No.: US 7,838,921 B2
(45) Date of Patent: Nov. 23, 2010

(54) MEMORY CELL ARRANGEMENTS

(75) Inventors: Josef Willer, Riemerling (DE); Thomas Mikolajick, Dresden (DE); Nicolas Nagel, Dresden (DE); Michael Specht, Munich (DE)

(73) Assignee: Qimonda AG, Munich (DE)

( * ) Notice: Subject to any disclaimer, the term of this patent is extended or adjusted under 35 U.S.C. 154(b) by 786 days.

(21) Appl. No.: 11/526,149

(22) Filed: Sep. 22, 2006

(65) Prior Publication Data
US 2008/0073694 A1 Mar. 27, 2008

(51) Int. Cl.
*H01L 29/788* (2006.01)
(52) U.S. Cl. .................. 257/316; 257/315; 438/626; 438/631; 438/633
(58) Field of Classification Search .................. 257/316, 257/315; 438/626, 631, 633, 634, 636, 669
See application file for complete search history.

(56) References Cited

U.S. PATENT DOCUMENTS 5,120,670 A * 6/1992 Bergmont .................. 438/261

5,372,969 A * 12/1994 Moslehi ..................... 438/106
2004/0161881 A1 * 8/2004 Shin et al. .................. 438/128
2006/0240612 A1 10/2006 Lee

* cited by examiner

*Primary Examiner*—Wael M Fahmy
*Assistant Examiner*—Tucker Wright

(57) ABSTRACT

A memory cell arrangement includes a first memory cell string having a plurality of serially source-to-drain-coupled transistors, at least some of them being memory cells, a second memory cell string having a plurality of serially source-to-drain-coupled transistors, at least some of them being memory cells. A dielectric material is between and above the first memory cell string and the second memory cell string. A source/drain line groove is defined in the dielectric material. The source/drain line groove extends from a source/drain region of one transistor of the first memory cell string to a source/drain region of the second memory cell string. Electrically conductive filling material is disposed in the source/drain line groove. Dielectric filling material is disposed in the source/drain line groove between the source/drain regions.

26 Claims, 7 Drawing Sheets

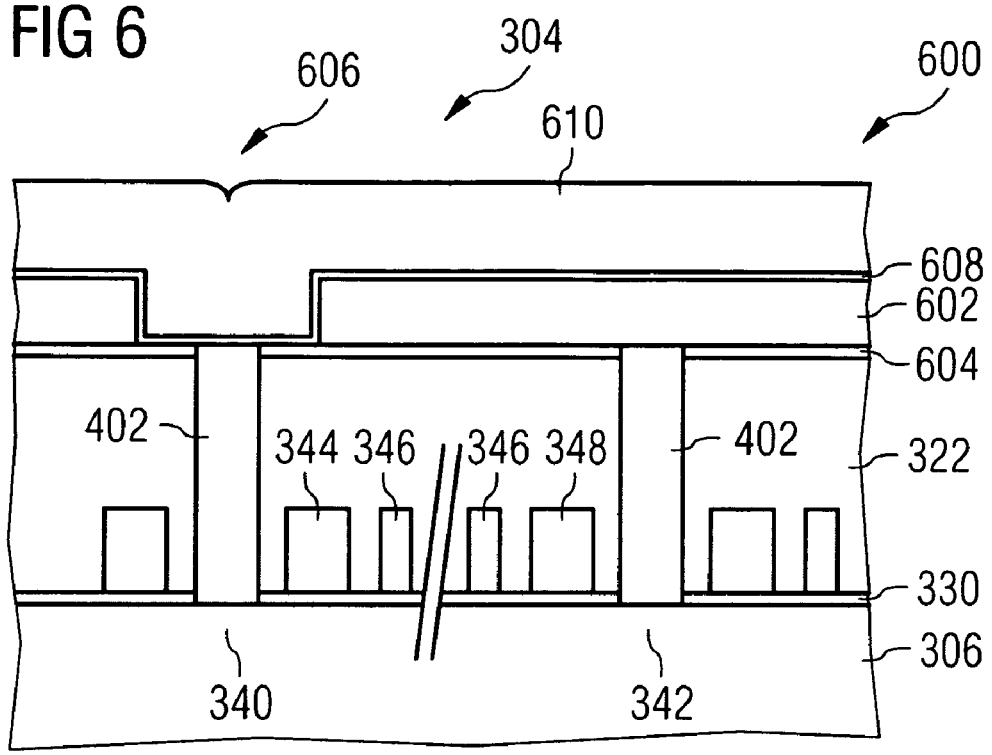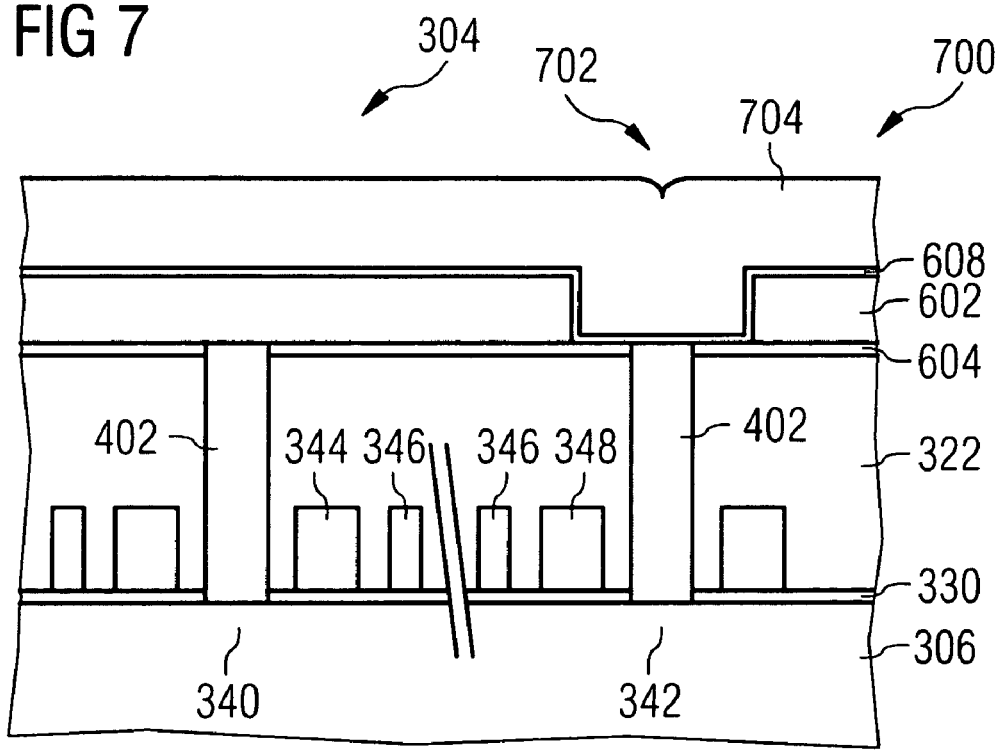

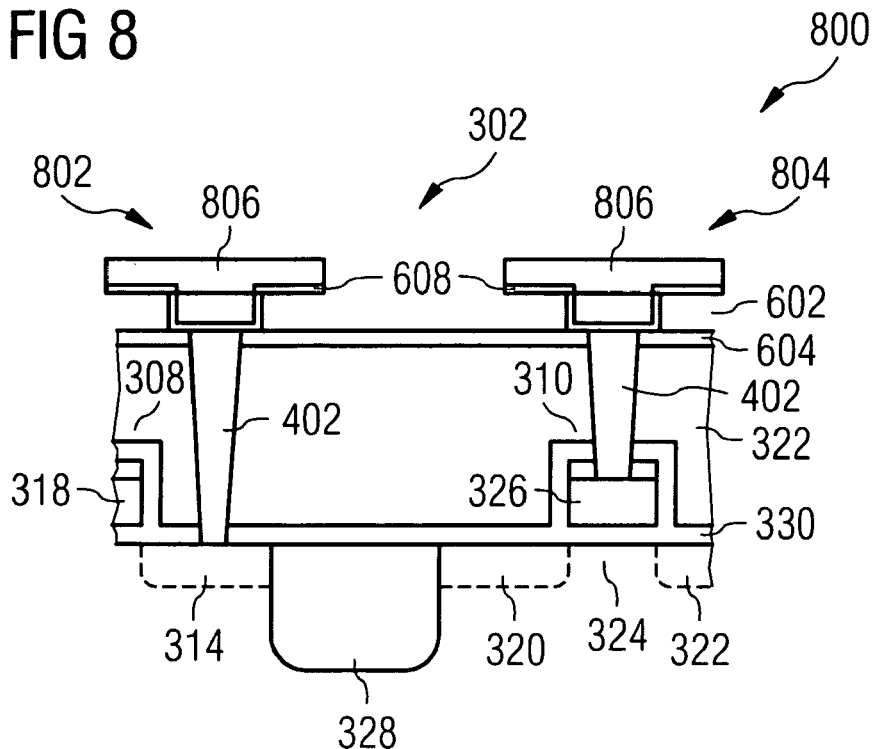

- Form a plurality of memory cells, each memory cell comprising a first source/drain region, a second source/drain region, an active region between the first source/drain region and the second source/drain region, and a gate region — 902

- Form bit lines coupled to the first source/drain regions or the second source/drain regions of the memory cells, the bit lines being made of a metal having a resistivity of less than 10 $\mu\Omega$cm — 904

MEMORY CELL ARRANGEMENTS

TECHNICAL FIELD

The invention relates to memory cell arrangements and methods of manufacturing memory cell arrangements.

BACKGROUND

In a conventional NAND memory cell arrangement, the memory cells are coupled to the bit lines via respective contact holes that are etched into inter metal dielectric material. The contact holes are filled with poly-silicon.

It is desirable to provide minimum pitch contact holes of a NAND memory cell arrangement. However, in order to achieve this, new and expensive lithography techniques are required with a higher resolution.

For these and other reasons, there is a need for the present invention as set forth in the following embodiments.

SUMMARY OF THE INVENTION

In an embodiment of the invention, a memory cell arrangement is provided that includes a first memory cell string having a plurality of serially source-to-drain-coupled transistors, at least some of them being memory cells, a second memory cell string having a plurality of serially source-to-drain-coupled transistors, at least some of them being memory cells, dielectric material between and above the plurality of transistors of the first memory cell string and the plurality of transistors of the second memory cell string, a source/drain line groove in the dielectric material, the source/drain line groove extending from a source/drain region of one transistor of the plurality of transistors of the first memory cell string to a source/drain region of one transistor of the plurality of transistors of the second memory cell string, electrically conductive filling material in the source/drain line groove coupled to the source/drain region of the transistor of the plurality of transistors of the first memory cell string and to the source/drain region of the transistor of the plurality of transistors of the second memory cell string, and dielectric filling material in the source/drain line groove between the source/drain region of the transistor of the plurality of transistors of the first memory cell string and the source/drain region of the transistor of the plurality of transistors of the second memory cell string.

Features of embodiments of the invention will be better understood when taken in view of the following drawings and detailed description.

BRIEF DESCRIPTION OF THE DRAWINGS

For a more complete understanding of the present invention, and the advantages thereof, reference is now made to the following descriptions taken in conjunction with the accompanying drawings, in which:

FIG. 6 illustrates a cross-sectional view along the cross-section line A-A of a portion of the NAND array portion shown in FIG. 1 at a fourth stage of manufacture in accordance with an embodiment of the present invention;

FIG. 7 illustrates a cross-sectional view along the cross-section line A-A of a portion of the NAND array portion shown in FIG. 1 at a fifth stage of manufacture in accordance with an embodiment of the present invention;

FIG. 8 illustrates a cross-sectional view of a portion of the periphery portion of the memory cell arrangement in accordance with an embodiment of the present invention; and FIG. 9 illustrates a flow diagram showing a method of manufacturing a memory cell arrangement in accordance with an embodiment of the present invention.

DETAILED DESCRIPTION OF ILLUSTRATIVE EMBODIMENTS

As used herein the terms connected and coupled are intended to include both direct and indirect connection and coupling, respectively. In the figures, identical or similar elements are designated by identical reference numbers, if appropriate.

A conventional NAND memory cell arrangement includes a plurality of NAND memory cell strings formed in a carrier, e.g., in a semiconductor substrate such as a silicon substrate. Each of the plurality of NAND memory cell strings includes a plurality of memory cells, which are connected with each other in a series connection, wherein the source/drain regions of the memory cells of each NAND memory cell string are serially connected with each other. Each NAND memory cell string is isolated from an adjacent NAND memory cell string by means of shallow trench isolations (STI). Furthermore, an inter metal dielectric material is provided on the memory cells of the NAND memory cell strings. Contact holes are etched into the inter metal dielectric material. The contact holes are filled with poly-silicon to obtain minimum sized contacts. Furthermore, bit lines are formed on the poly-silicon using e.g., a dual damascene process scheme with tungsten (W) as the electrically conductive bit line material. It should be noted that the conventional bit line materials such as tungsten or tungsten silicide have a resistivity of more than 10 μohmcm.

Figure 1:
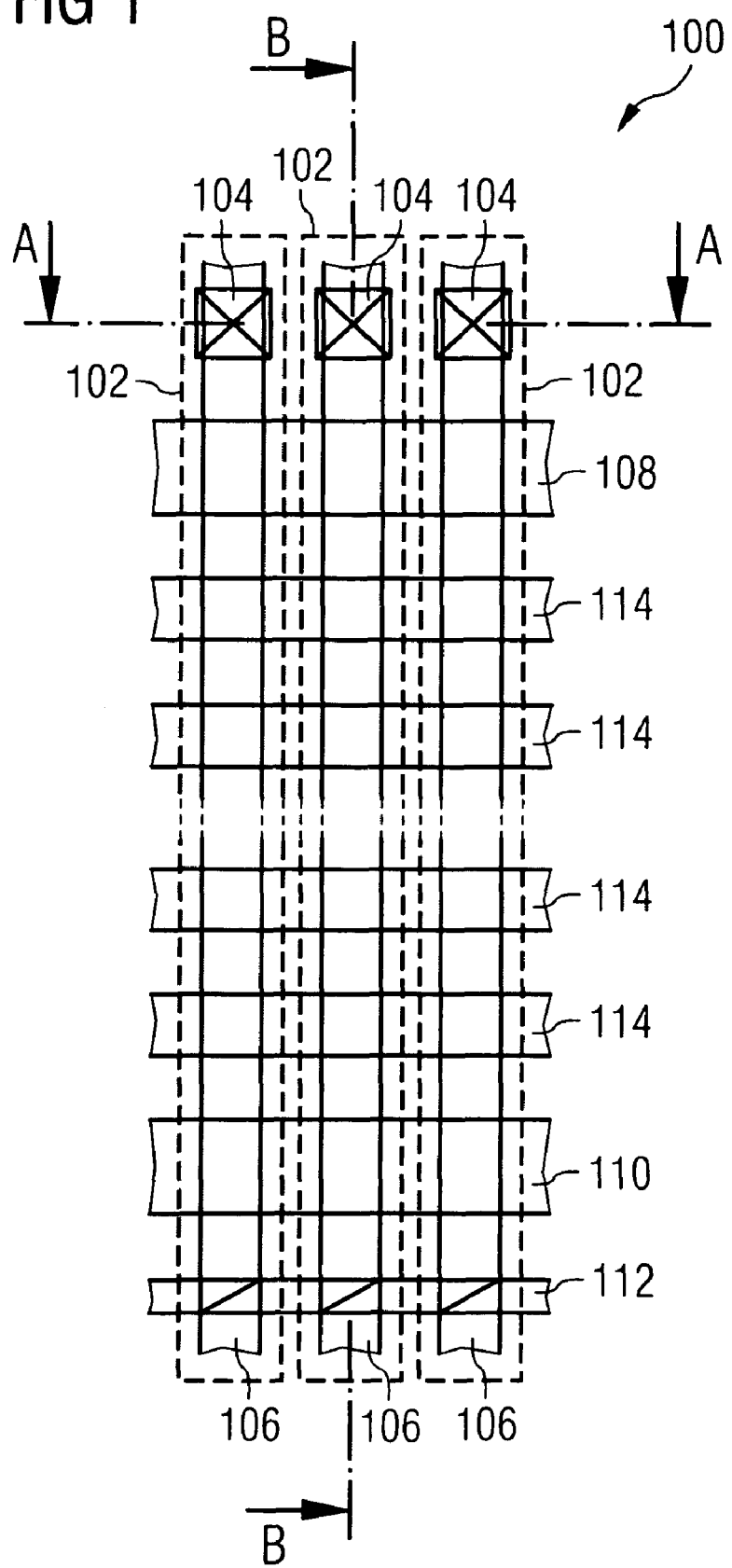
FIG. 1 illustrates a layout of a NAND array portion of a memory cell arrangement in accordance with an embodiment of the present invention.

FIG. 1 illustrates a layout of a NAND array portion 100 of a memory cell arrangement in accordance with an embodiment of the present invention.

The NAND array portion 100 includes a plurality of non-volatile memory cells (not shown in FIG. 1), which are arranged in rows and columns, and which are connected to each other in accordance with a NAND structure.

FIG. 1 shows the layout of three NAND memory cell strings 102, each including a plurality of non-volatile memory cells. The non-volatile memory cells of each NAND memory cell string 102 are arranged in respective active areas. The non-volatile memory cells of adjacent NAND memory cell strings 102 are electrically isolated from each other by means of shallow trench isolation (STI). The non-volatile memory cells of each NAND memory cell string 102 are source-to-drain-coupled to one another in a series connection. Bit line contacts 104 are provided connecting a respective bit line 106 to a source/drain region of a drain select gate, which may be implemented as a field effect transistor. The drain select gate is connected to a drain select line 108 (also referred to as bit select line). In addition, a source select line 110 is provided at the end of the NAND memory cell strings 102 that are opposite to that end at which the bit select line 108 is provided. The source select line 110 is connected to a source select gate of each NAND memory cell string 102. In an embodiment of the invention, a source/drain region of the drain select gate is connected to a first memory cell of the respective NAND memory cell string 102 and a source/drain region of the source select gate is connected to a last memory cell of the respective NAND memory cell string 102. Thus, the drain select gate and the source select gate are located at opposing ends of a respective NAND memory cell string 102.

Although the embodiments describe a NAND array architecture 100, in other words an architecture having a plurality of memory cells strings 102 being connected so as to provide a NAND connection, any other type of logic function connection may be provided in an alternative embodiment of the invention. Thus, the array architecture is not limited to a NAND array architecture 100.

Each source select gate is positioned at an intersection of a bit line 106 and a source select line 110. Each drain select gate is positioned at an intersection of a bit line 106 and a drain select line 108. The drain of each source select gate is connected to the source terminal of the first charge storage transistor of the corresponding NAND memory cell string 102. The source of each source select gate is connected to a common source line 112. A control gate of each source select gate is connected to the source select line 110. The common source line 112 may be connected to ground potential. The common source line 112 interconnects the active areas of the NAND memory cell strings 102. NAND memory cell string word lines 114 are provided to provide a respective gate control signal to the non-volatile memory devices of a respective row of the NAND array portion 100. The number of NAND memory cell string word lines 114 corresponds to the number of non-volatile memory devices provided in each NAND memory cell string 102. In one embodiment of the invention, the NAND memory cell string word lines 114 are spaced apart from each other at a distance of the minimum feature size (F) of the respective process technology used.

Figure 2:
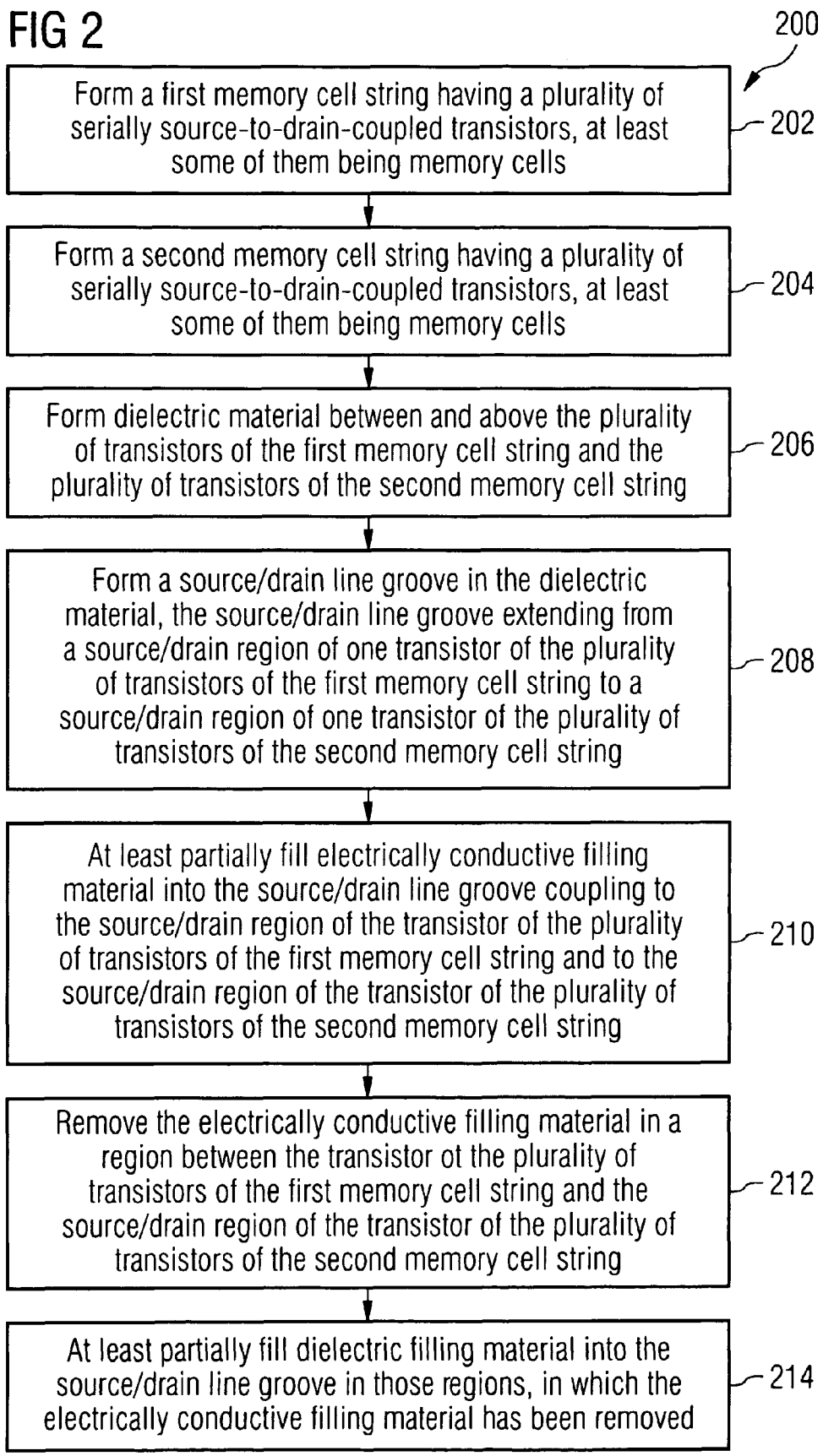
FIG. 2 illustrates a flow diagram showing a method of manufacturing a memory cell arrangement in accordance with an embodiment of the present invention.

FIG. 2 illustrates a flow diagram 200 showing a method of manufacturing a memory cell arrangement in accordance with an embodiment of the present invention.

At 202, a first NAND memory cell string 102 is formed having a plurality of serially source-to-drain-coupled transistors, at least some of them being memory cells.

At 204, a second NAND memory cell string 102 is formed having a plurality of serially source-to-drain-coupled transistors, at least some of them being memory cells.

It should be mentioned that the first NAND memory cell string 102 and the second NAND memory cell string 102 may be formed simultaneously or one after the other, wherein the first NAND memory cell string 102 may be formed before or after the second NAND memory cell string 102.

In an embodiment of the invention, in addition to the memory cells, the first and second NAND memory cell strings 102 may each include the drain select line 108 (also referred to as bit select line), the source select line 110 being connected to the source select gate of each NAND memory cell string 102, and the common source line 112. In alternative embodiments of the invention, the drain select line 108 and the drain select gate may be omitted. Furthermore, in another embodiment of the invention, the source select line 110 and the corresponding source select gate may be omitted. In yet another embodiment of the invention, the common source line 112 may be omitted.

At 206, dielectric material is formed between and above the plurality of transistors of the first NAND memory cell string 102 and the plurality of transistors of the second NAND memory cell string 102. The dielectric material may be an inter metal dielectric material such as silicon oxide or silicon nitride. In alternative embodiments of the invention, low-k dielectrics may be used such as a dielectric material having a dielectric constant of less than 3.9, such as e.g., SiLK. Any other suitable dielectric material may be used in an alternative embodiment of the invention.

At 208, a source/drain line groove is formed in the dielectric material, the source/drain line groove extending from a source/drain region of one transistor of the plurality of transistors of the first NAND memory cell string 102 to a source/drain region of one transistor of the plurality of transistors of the second NAND memory cell string 102. In an embodiment of the invention, the source/drain line groove exposes at least a portion of a source/drain region of one transistor of the plurality of transistors of the first NAND memory cell string 102 and at least a portion of a source/drain region of one transistor of the plurality of transistors of the second NAND memory cell string 102. The first NAND memory cell string 102 and the second NAND memory cell string 102 are located next to each other so that in accordance with one embodiment of the invention, the source/drain line groove is formed substantially perpendicular to the extension direction of the first NAND memory cell string 102 and the second NAND memory cell string 102 and exposing at least a portion of a source/drain region of one transistor of the plurality of transistors of the first NAND memory cell string 102 and at least a portion of a source/drain region of one transistor of the plurality of transistors of the second NAND memory cell string 102.

At 210, electrically conductive filling material is at least partially filled into the source/drain line groove coupling to the source/drain region of the transistor of the plurality of transistors of the first NAND memory cell string 102 and to the source/drain region of the transistor of the plurality of transistors of the second NAND memory cell string 102. The electrically conductive filling material may be poly-silicon, although any other suitable electrically conductive material may be used in an alternative embodiment of the invention. The electrically conductive filling material may serve as a bit line contact material for providing electrical coupling between the respective bit line to be formed and the source/drain region that should be coupled to the respective bit line to be formed and that is exposed by the source/drain line groove.

At 212, the electrically conductive filling material is removed in a region between the transistor of the plurality of transistors of the first NAND memory cell string 102 and the source/drain region of the transistor of the plurality of transistors of the second NAND memory cell string 102. In an embodiment of the invention, this is carried out by applying a line mask with openings in the regions above the source/drain line groove, in which the electrically conductive filling material should be removed. The electrically conductive filling material may then be etched using the line mask by means of an anisotropic etching such as a reactive ion etching (RIE). However, any other anisotropic etching may be used in an alternative embodiment of the invention.

At 214, dielectric filling material is at least partially filled into the source/drain line groove in those regions, in which the electrically conductive filling material has been removed. The dielectric filling material may be inter metal dielectric material such as silicon oxide, silicon nitride or the like. The dielectric filling material isolates the bit line contacts from each other and thereby also isolates the first NAND memory cell string 102 and the second NAND memory cell string 102 from each other.

In general, an arbitrary number of NAND memory cell strings 102 can be provided and can be manufactured in the way as described above. Furthermore, an arbitrary number of memory cells can be provided in each NAND memory cell string 102, e.g., 4, 8, 16, 32, etc.

In an embodiment of the invention, minimum pitch contact holes of NAND arrays are provided having roughly the same width in both lateral directions without the need of a lithography technology with a higher resolution. Furthermore, the resolution requirements of contact hole printing can be met using current generation of lithography.

In an embodiment of the invention, a new combination of source line formation and contact hole formation allows to avoidance of minimum geometry printing of contact holes. In another embodiment of the invention, it is possible to use a low resistive metal (having a resistivity of e.g., less than 10 μΩcm, e.g., less than or equal to 6 μΩcm, e.g., less than or equal to 5 μΩcm; examples of such low resistive metals are Cu, Al, Ag, or Au) for the bit lines, as will be described in more detail below.

Figure 3:
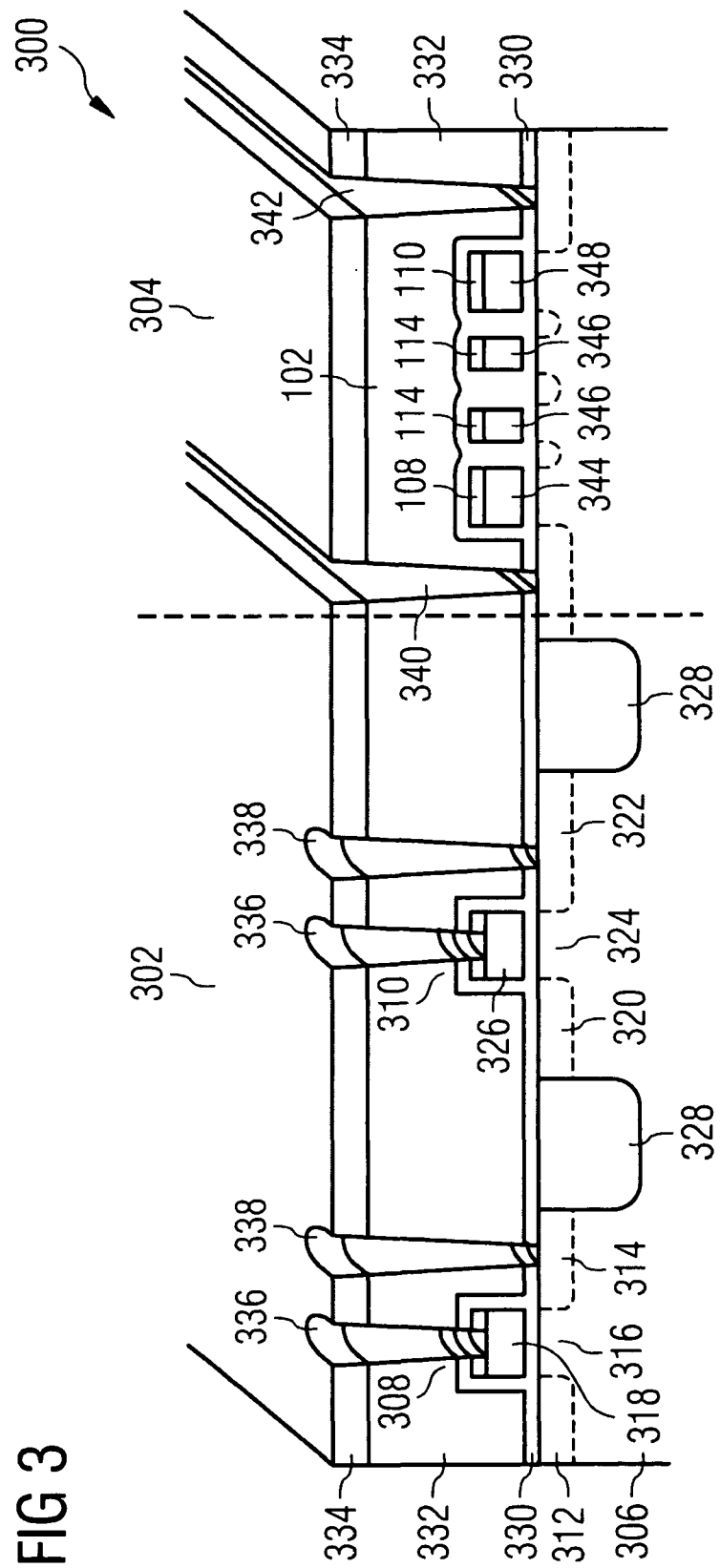
FIG. 3 illustrates a cross-sectional perspective view, the cross-section being taken along the cross-section line B-B of the NAND array portion shown in FIG. 1 at a first stage of manufacture in accordance with an embodiment of the present invention.

FIG. 3 illustrates a cross-sectional perspective view 300, the cross-section being taken along the cross-section line B-B of the NAND array portion 100 shown in FIG. 1 at a first stage of manufacture in accordance with an embodiment of the present invention.

The NAND array portion 100 is formed in and on a carrier 306, e.g., a substrate. In one embodiment of the invention, the semiconductor substrate is a bulk semiconductor substrate, in an alternative embodiment of the invention, the semiconductor substrate is a silicon-on-insulator semiconductor substrate (SOI). The semiconductor material may be silicon, in an alternative embodiment of the invention, the semiconductor material may be a compound semiconductor material such as a IV-IV-semiconductor material (such as silicon germanium (SiGe)), a III-V-semiconductor material (such as gallium arsenide (GaAs)) or a I-VI-semiconductor material. Other appropriate semiconductor materials may also be used in alternative embodiments of the invention.

The cross-sectional perspective view 300 shows a CMOS periphery region 302 on the left hand side of the cross-sectional perspective view 300 and a NAND memory cell string region 304 on the right hand side of the cross-sectional perspective view 300.

A plurality of transistors forming periphery circuits such as charge pumps, driving circuits, control logic, and the like are formed in the CMOS periphery region 302. The CMOS periphery region 302 includes n-type transistors as well as p-type transistors, although in an alternative embodiment of the invention, the periphery region may include only n-type transistors or only p-type transistors.

As a simple example just for illustration purposes, FIG. 3 shows a first transistor 308 and a second transistor 310 in the CMOS periphery region 302. In general an arbitrary number of transistors and other required electrical components may be provided in the CMOS periphery region 302 to form the desired circuits, e.g., some or all of the circuits mentioned above.

The first transistor 308 includes a first source/drain region 312, a second source/drain region 314, an active region 316 between the first source/drain region 312 and the second source/drain region 314, and a gate region 318 above the active region 316. The active region 316 may be rendered electrically conductive (in other words form a conductive channel) in response to an appropriate voltage application to the gate region 318 and to the first source/drain region 312 and the second source/drain region 314. The first source/drain region 312 and the second source/drain region 314 are n-doped regions (in the case that the first transistor 308 is an n-type transistor) or p-doped regions (in the case that the first transistor 308 is a p-type transistor).

The second transistor 310 includes a first source/drain region 320, a second source/drain region 322, an active region 324 between the first source/drain region 320 and the second source/drain region 322, and a gate region 326 above the active region 324. The active region 324 may be rendered electrically conductive (in other words form a conductive channel) in response to an appropriate voltage application to the gate region 326 and to the first source/drain region 320 and the second source/drain region 322. The first source/drain region 320 and the second source/drain region 322 are n-doped regions (in the case that the second transistor 310 is an n-type transistor) or p-doped regions (in the case that the second transistor 310 is a p-type transistor).

The first transistor 308 and the second transistor 310 are isolated from each other by means of shallow trench isolations (STI) 328, which may be formed from silicon oxide, for example.

A gate isolation layer 330, e.g., made of silicon oxide, is formed on the main processing surface of the carrier 306 in the CMOS periphery region 302 and in the NAND memory cell string region 304 inter alia between (in vertical direction) the active regions 316, 324 and the gate regions 318, 326 of the first and second transistors 308, 310, respectively. The gate regions 318, 326 may be made of poly-silicon, although in alternative embodiments of the invention, any other electrically conductive material may be used.

The NAND memory cell string region 304 includes a plurality of NAND memory cell strings 102, which are arranged next to one another and which are separated from one another by means of shallow trench isolations (STI). Each of the NAND memory cell strings 102 includes a drain select gate 344, a plurality of memory cells 346 and a source select gate 348.

In one embodiment of the invention, the transistors 308, 310 in the CMOS periphery region 302 and the NAND memory cell strings 102 in the NAND memory cell string region 304 are covered by a protective layer and inter metal dielectric layer 332. The inter metal dielectric layer 332 may be made of silicon oxide, silicon nitride or any other suitable dielectric material. By way of example, a low-k dielectric material (e.g., having a dielectric constant of less than 3.9) such as e.g., SiLK may be provided for the inter metal dielectric layer 332.

In an embodiment of the invention, the memory cells 346 are charge storage memory cells 346.

In an embodiment of the invention, the charge storage memory cells 346 are floating gate memory cells 346. In this embodiment, the gate region 326 may include an electrically conductive material (also referred to as floating gate region) such as poly-silicon disposed on or above the gate isolation layer 330 (which in this case serves as a tunnel dielectric and may have thickness in the range from 3 nm to 15 nm), a dielectric layer disposed on or above the electrically conductive material and a control gate region disposed on or above the dielectric layer. The control gate region, which also may be made of electrically conductive material such as poly-silicon is coupled to the word lines for individually controlling the conduction state of the memory cells 346 of the NAND memory cell strings 102.

In another embodiment of the invention, the charge storage memory cells 346 are charge trapping memory cells 346. In this embodiment, the charge trapping memory cells 346 may include a charge trapping layer structure on or above the gate isolation layer 330. The charge trapping layer structure may include a dielectric layer made of a material selected from the group consisting of silicon nitride ($Si_3N_4$), aluminum oxide ($Al_2O_3$), hafnium oxide ($HfO_2$), zirconium oxide ($ZrO_2$), yttrium oxide ($Y_2O_3$), lanthanum oxide ($LaO_2$), amorphous silicon, tantalum oxide ($Ta_2O_5$), titanium oxide ($TiO_2$), and an aluminate. An example for an aluminate is an alloy of the components aluminum, zirconium and oxygen (AlZrO).

In an alternative embodiment of the invention, the charge trapping layer structure includes one, two, three, four or even more dielectric layers being formed above one another.

Furthermore, in an alternative embodiment of the invention, the charge trapping layer structure includes a nitride-oxide layer structure, thereby forming an ONO structure together with the gate isolation layer, which may be made of an oxide.

Furthermore, a control gate layer may be formed on or above the charge trapping layer structures In an embodiment of the invention, optionally, an auxiliary mask layer 334, such as a hardmask layer 334, is deposited on or above the inter metal dielectric layer 332. The hardmask layer 334 may be made of silicon oxide, silicon nitride, carbon or the like.

Referring back to FIG. 3, in the CMOS periphery region 302, non-minimum sized contact holes are formed in the inter metal dielectric layer 332, e.g., gate contact holes 336 providing electrical contact to the gate regions 318, 326 of the first and second transistors 308, 310, respectively, and source/drain contact holes 338 providing electrical contact to the source/drain regions 314, 322 of the first and second transistors 308, 310, respectively. The gate contact holes 336 and the source/drain contact holes 338 have a dimension that is greater than the maximum resolution of the respectively used lithographic process (in other words, the dimensions are larger than the minimum feature size F of the respectively used lithographic process). Thus, the manufacturing of the gate contact holes 336 and the source/drain contact holes 338 is rather relaxed with respect to the lithographic technology used.

However, in an embodiment of the invention, it is desirable to provide a minimum pitch of the contact holes of the NAND memory cell strings 102 in the NAND memory cell string region 304. In this context, in an embodiment of the invention, source/drain line grooves are formed in the inter metal dielectric layer 332 in the NAND memory cell string region 304, e.g., a drain line groove 340 (in the following also referred to as bit line groove 340) at least partially exposing a source/drain region of the drain select gate of a plurality, e.g., of all, of the NAND memory cell strings 102 of the NAND array portion 100. In case that no drain select gate is provided, the drain line groove 340 is at least partially exposing the source/drain region of each respective first memory cell 346 of the NAND memory cell strings 102. As will be described in more detail below, the bit line contact holes for connecting the source/drain region of the drain select gate of a plurality, e.g., of all, of the NAND memory cell strings 102 will be formed in the drain line groove 340.

Furthermore, in an embodiment of the invention, a source line groove 342 is formed as another example of a source/drain line groove. The source line groove 342 is at least partially exposing a source/drain region of the source select gate of a plurality, e.g., of all, of the NAND memory cell strings 102. The source line groove 342 serves for the manufacturing of the common source line 112, for example. In an embodiment of the invention, the drain line groove 340 and the source line groove 342 both may be provided. In alternative embodiments of the invention, only the drain line groove 340 or only the source line groove 342 may be provided.

In an exemplary embodiment of the invention, the contact holes 336, 338 in the CMOS periphery region 302 and the source/drain line grooves (e.g., 342, 340) in the NAND memory cell string region 304 are formed in one common lithography and etch process simultaneously using only one mask. Since the source/drain line grooves (e.g. 342, 340) in the NAND memory cell string region 304 have an elongated shape, in other words, the shape of short lines, they can be printed more easily than a square shaped contact hole.

Next, the contact holes 336, 338 in the CMOS periphery region 302 and the source/drain line grooves (e.g. 342, 340) in the NAND memory cell string region 304 are filled and possibly overfilled with electrically conductive material 402 which will serve as the contact material for the bit lines and as electrically conductive material for the common source line 112. Thus, in one embodiment of the invention, the bit line contacts and the common source line 112 are formed from the same material. The electrically conductive material 402 may be an electrically conductive material 402 selected from a group of materials consisting of titanium (Ti), titanium nitride (TiN) and tungsten (W), although other electrically conductive material, e.g., other metals may be used in alternative embodiments of the invention. In particular, a CVD process may be used to deposit an alloy of Si and Ge (say 0 to 30 at % Ge). Such a material can be etched with good selectivity with respect to silicon substrate. The overfilling material is then planarized, e.g., by means of a chemical mechanical polishing (CMP) process, with stop on the upper surface of the inter metal dielectric layer 332 or optionally, an auxiliary mask layer 334. The resulting structure 400 is shown in FIG. 4 in a cross-sectional view along the cross-section line B-B of the NAND array portion shown in FIG. 1.

Figure 4:
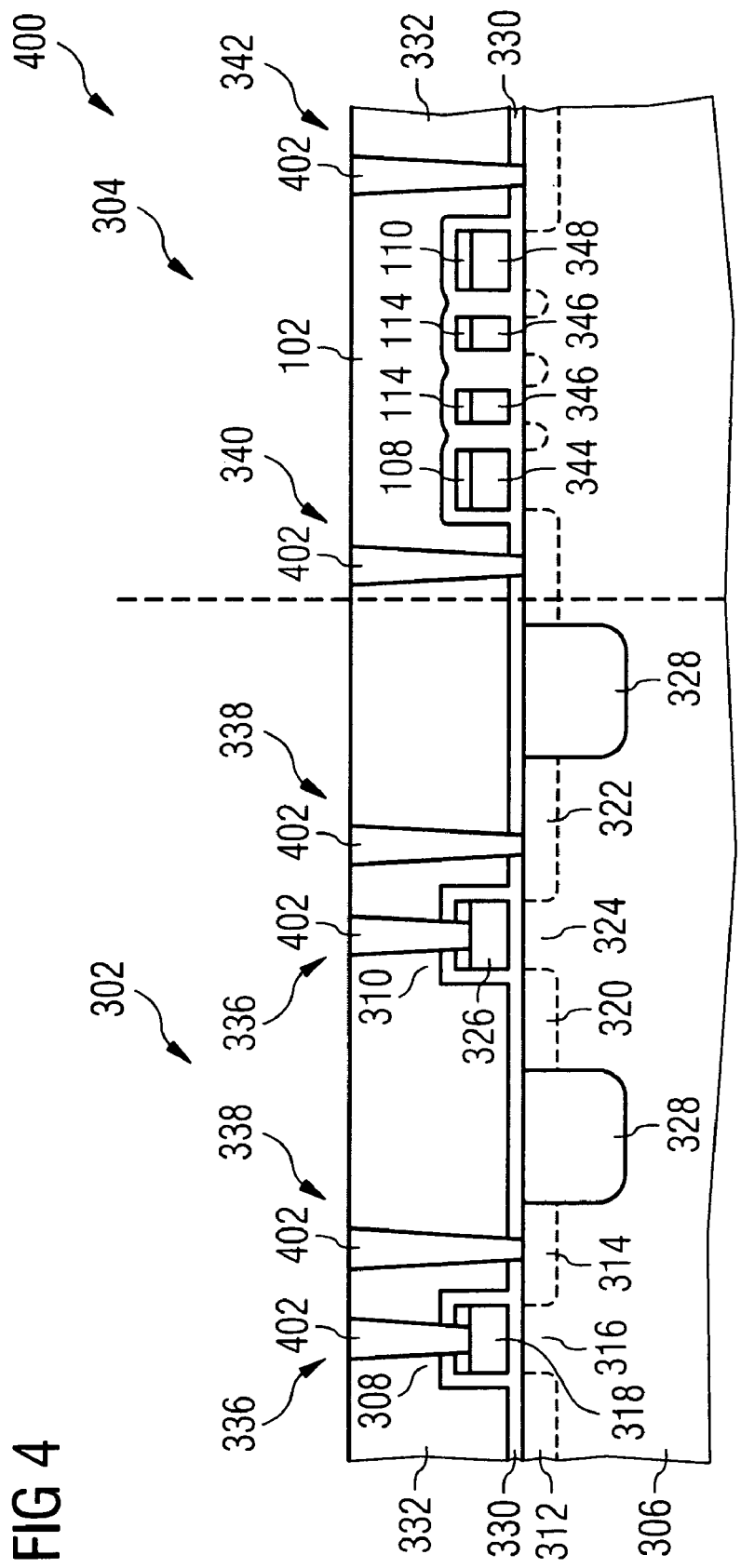
FIG. 4 illustrates a cross-sectional view along the cross-section line B-B of the NAND array portion shown in FIG. 1 at a second stage of manufacture in accordance with an embodiment of the present invention.
Figure 5A:
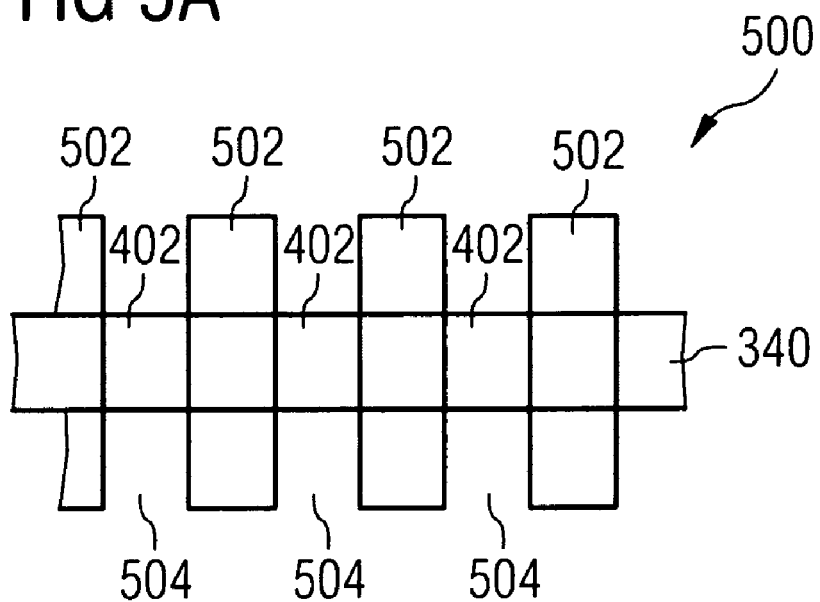
FIGS. 5A and 5B illustrate a layout view of a portion of the NAND array portion shown in FIG. 1 (FIG. 5A) and a cross-sectional view along the cross-section line A-A of a portion of the NAND array portion shown in FIG. 1 (FIG. 5B) at a third stage of manufacture in accordance with an embodiment of the present invention.

Next, a line mask 502 is applied to the structure 400 of FIG. 4 (see layout portion 500 of a top view of the NAND memory cell arrangement in FIG. 5A). The line mask 502 has line or slit shaped openings 504. The intersecting regions of the openings 504 of the line mask 502 with the drain line groove 340 define the regions of the drain line groove 340 that are to be etched, thereby removing the electrically conductive material 402 in those exposed regions. The etching may be an anisotropic etching such as reactive ion etching (RIE). However, any other anisotropic etching may be used in an alternative embodiment of the invention. By using a line mask 502, a smaller pitch of the bit line contacts to be formed (in other words a smaller distance of the bit line contacts to be formed in the length direction of the source/drain line groove (e.g., 340)) can be provided compared to the conventional approach.

Figure 5B:
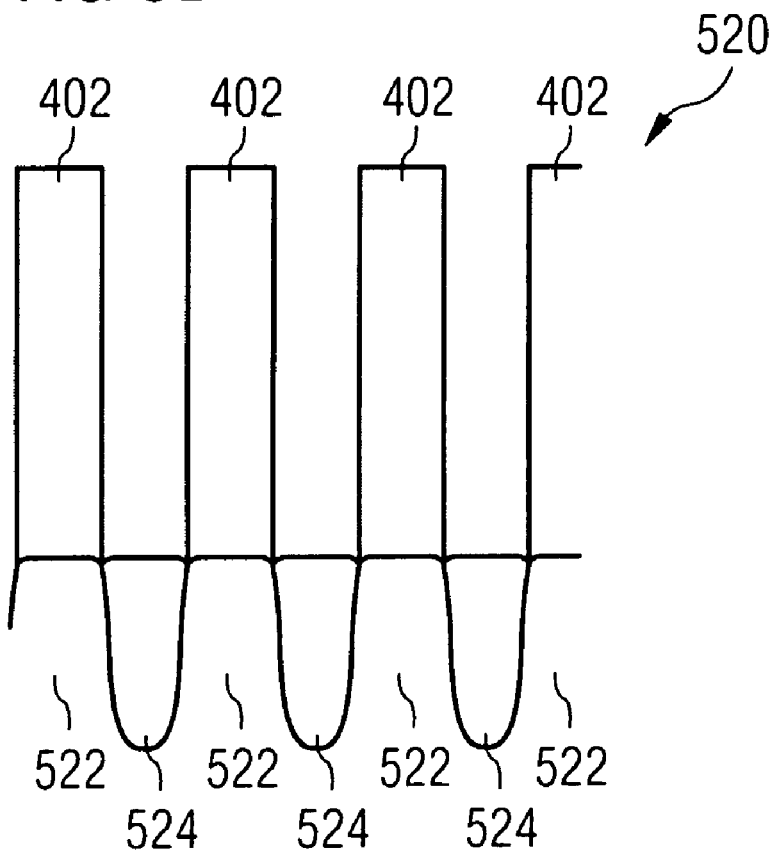

FIG. 5B illustrates a cross-sectional view 520 along the cross-section line A-A of a portion of the NAND array portion shown in FIG. 5A. FIG. 5B shows the active areas 522 of the NAND memory cell strings 102 including the source/drain regions and the active regions of the memory cells and the select gates, as described above. The active areas 522 of adjacent NAND memory cell strings 102 are isolated from one another by means of shallow trench isolations (STI) 524. Furthermore, the electrically conductive material 402 serving as the bit line contacts are shown in FIG. 5B.

FIG. 6 shows an enlarged view 600 of the NAND memory cell string region 304 at the following stage of its manufacturing in a cross-sectional view along the cross-section line B-B illustrating the manufacture of the bit line. After having removed portions of the electrically conductive material 402 in accordance with the applied line mask 502, further inter metal dielectric material 602 is deposited, thereby also filling the spaces that had been produced due to the removal of the electrically conductive material 402. In one embodiment of the invention, as an option, an etch stop layer 604, e.g., made of silicon nitride, silicon oxi-nitride, or aluminum oxide is deposited on the inter metal dielectric layer 332, in which case the further inter metal dielectric material 602 is deposited on the etch stop layer 604.

Thus, bit line contacts are formed, which are isolated from each other by means of the deposited further inter metal dielectric material 602. The further inter metal dielectric 602 material may be an oxide, such as silicon oxide, a nitride, such as silicon nitride, or a low-k dielectric material, such as e.g., SiLK.

In accordance with the so called dual damascene process scheme, the further inter metal dielectric material 602 is patterned (e.g., etched with a stop on the optional etch stop layer 604), thereby forming a first trench 606 above the drain line groove 340, thereby exposing the upper surface of the drain line groove 340. Then, an adhesion layer and/or an electrically conductive diffusion barrier layer (which may be formed by one or a plurality of layers) 608 may be deposited on the entire surface of the further inter metal dielectric material 602 and the exposed surfaces of the optional etch stop layer 604 and the drain line groove 340. The adhesion layer and/or electrically conductive diffusion barrier layer 608 may be formed by means of an atomic layer deposition (ALD) process by depositing titanium (Ti), tantalum (Ta), titanium nitride (TiN), or tantalum nitride (TaN). The adhesion layer and/or electrically conductive diffusion barrier layer 608 may include a plurality of layers such as a double layer structure made of e.g., Ti/TiN or pure Ta/TaN. The pure Ta or Ti would react with the poly-silicon of the drain line groove 340 to form tantalum silicide (TaSi) or (TiSi), respectively. Thus, a high quality alloyed ohmic contact to heavily doped semiconductor material would be formed. In general, any other suitable stuffed type diffusion barrier material may be used in an alternative embodiment of the invention.

Then, the bit line conductor, i.e., the material of a bit line 610, such as Cu, is deposited using a plating process. In alternative embodiments of the invention, Al, Ag, or Au may be used for the bit line 610. It should be noted that for the bit line 610 material that does not need a diffusion barrier, the electrically conductive diffusion barrier layer 608 may be omitted. The structure is then planarized, e.g., using a CMP process. The resulting structure is shown in FIG. 6.

Since the bit line conductor is formed after high temperature processes like the usually provided anneal of the source/drain regions of the transistors of the NAND memory cell arrangement (usually a temperature in the range from 850° C. to 1050° C.), a metal can be used that has a melting temperature that is below those temperatures but has a lower resistivity than the conventionally used materials for the bit lines such as tungsten (W) or tungsten silicide (WSi).

FIG. 7 shows an enlarged view 700 of the NAND memory cell string region 304 at a following stage of its manufacturing in a cross-sectional view illustrating the manufacture of the source line.

In one embodiment of the invention, as an option, the etch stop layer 604, e.g., made of silicon nitride, silicon oxi-nitride, or aluminum oxide is deposited on the inter metal dielectric layer 332, in which case the further inter metal dielectric material 602 is deposited on the etch stop layer 604.

The further inter metal dielectric material 602 may be an oxide, such as silicon oxide, a nitride, such as silicon nitride, or a low-k dielectric material, such as e.g., SiLK.

In accordance with the so-called dual damascene process scheme, the further inter metal dielectric material 602 is patterned (e.g., etched with a stop on the optional etch stop layer 604), thereby forming a second trench 702 above the source line groove 342, thereby exposing the upper surface of the source line groove 342. Then, an adhesion layer and/or an electrically conductive diffusion barrier layer (which may be formed by one or a plurality of layers) 608 may be deposited on the entire surface of the further inter metal dielectric material 602 and the exposed surfaces of the optional etch stop layer 604 and the source line groove 342. The adhesion layer and/or electrically conductive diffusion barrier layer 608 may be formed by means of an atomic layer deposition (ALD) process depositing titanium (Ti), tantalum (Ta), or tantalum nitride (TaN). The adhesion layer and/or electrically conductive diffusion barrier layer 608 may include a plurality of layers such as a double layer structure made of e.g., Ti/TiN or pure Ta/TaN. The pure Ta would react with the poly-silicon of the source line groove 342 to form tantalum silicide (TaSi). In general, any other suitable stuffed type diffusion barrier material may be used in an alternative embodiment of the invention.

Then, the source line conductor, i.e., the material of a source line 704, such as Cu, is deposited using a plating process. In alternative embodiments of the invention, Al, Ag or Au may be used for the source line 704. It should be noted that for the source line 704 material that does not need a diffusion barrier, the electrically conductive diffusion barrier layer 608 may be omitted. The structure is then planarized, e.g., using a CMP process. The resulting structure is shown in FIG. 7.

The source line 704 may be accessed e.g., using a bit line metal level with wiring (i.e., using conductors) that fits into the bit line pitch. In an alternative embodiment of the invention, the source line 704 may be accessed e.g., using a higher level metal layer than the bit line metal layer and a contact via that addresses landing pads formed in the bit line level.

FIG. 8 shows an enlarged view 800 of the CMOS periphery region 302 at a final stage of its manufacturing in a cross-sectional view illustrating the manufacture of the metal layer of the first and second transistors 308, 310. The processes as described with regard to FIGS. 6 and 7 are carried out for the CMOS periphery region 302 in a similar manner. In other words, a dual damascene process scheme is applied to the CMOS periphery region 302 in order to form the metal wiring for contacting the first and second transistors 308, 310. In an embodiment of the invention, an optional etch stop layer 604 is deposited on or above the upper surface of the inter metal dielectric layer 332 and the further inter metal dielectric material 602 is deposited on or above the etch stop layer 604. Next, third trenches 802 formed above the source/drain contact holes 338, (see FIG. 3) of the first and second transistors 308, 310 and fourth trenches 804 formed above the gate contact holes 336 of the first and second transistors 308, 310 (e.g., by etching the further inter metal dielectric material 602 with a stop on the optional etch stop layer 604).

Then, the adhesion layer and/or an electrically conductive diffusion barrier layer (which may be formed by one or a plurality of layers) 608 may be deposited on the entire surface of the further inter metal dielectric material 602 and the exposed surfaces of the optional etch stop layer 604 and the source/drain contact holes 338 and the gate contact holes 336, respectively. The adhesion layer and/or electrically conductive diffusion barrier layer 608 may be formed by means of an atomic layer deposition (ALD) process depositing titanium (Ti), tantalum (Ta), or tantalum nitride (TaN). The adhesion layer and/or electrically conductive diffusion barrier layer 608 may include a plurality of layers such as a double layer structure made of e.g., Ti/TiN or pure Ta/TaN. The pure Ta would react with the poly-silicon of the source/drain contact holes 338 and the gate contact holes 336 to form tantalum silicide (TaSi). In general, any other suitable stuffed type diffusion barrier material may be used in an alternative embodiment of the invention.

Then, the metal wiring conductor 806, i.e., the material of the metal wiring of the components (e.g., the first and second transistors 308, 310) in the CMOS periphery region 302, such as Cu, is deposited using a plating process. In alternative embodiments of the invention, Al, Ag, or Au may be used for the metal wiring conductor 806. It should be noted that for a metal wiring conductor 806 that does not need a diffusion barrier, the electrically conductive diffusion barrier layer 608 may be omitted. The structure is then planarized, e.g., using a CMP process. The resulting structure is shown in FIG. 8.

FIG. 9 illustrates a flow diagram 900 showing a method of manufacturing a memory cell arrangement in accordance with an embodiment of the present invention.

At 902, a plurality of memory cells is formed, each memory cell comprising a first source/drain region, a second source/drain region, an active region between the first source/drain region and the second source/drain region, and a gate region.

At 904, bit lines are formed coupled to the first source/drain regions or the second source/drain regions of the memory cells, the bit lines being made of a metal having a resistivity of less than 10 $\mu\Omega$cm.

In an embodiment of the invention, a memory cell arrangement is provided that includes a first memory cell string comprising a plurality of serially source-to-drain-coupled transistors, at least some of them being memory cells, a second memory cell string comprising a plurality of serially source-to-drain-coupled transistors, at least some of them being memory cells, dielectric material between and above the plurality of transistors of the first memory cell string and the plurality of transistors of the second memory cell string, a source/drain line groove in the dielectric material, the source/drain line groove extending from a source/drain region of one transistor of the plurality of transistors of the first memory cell string to a source/drain region of one transistor of the plurality of transistors of the second memory cell string, electrically conductive filling material in the source/drain line groove coupled to the source/drain region of the transistor of the plurality of transistors of the first memory cell string and to the source/drain region of the transistor of the plurality of transistors of the second memory cell string, and dielectric filling material in the source/drain line groove between the source/drain region of the transistor of the plurality of transistors of the first memory cell string and the source/drain region of the transistor of the plurality of transistors of the second memory cell string.

The first memory cell string and/or the second memory cell string may be a NAND memory cell string, in other words, a first memory cell string and/or a second memory cell string is connected in accordance with a NAND connecting structure.

In an embodiment of the invention, the transistor of the plurality of transistors of the first memory cell string is a select transistor selecting the memory cells of the first memory cell string. Furthermore, in an embodiment of the invention, the transistor of the plurality of transistors of the second memory cell string is a select transistor selecting the memory cells of the second memory cell string.

In another embodiment of the invention, the transistor of the plurality of transistors of the first memory cell string is a memory cell of the first memory cell string and the transistor of the plurality of transistors of the second memory cell string is a memory cell of the second memory cell string.

The memory cells may be non-volatile memory cells, e.g., floating gate memory cells or charge trapping memory cells.

Furthermore, the electrically conductive filling material may be a metal, e.g., a metal selected from a group consisting of titanium, titanium nitride, and tungsten.

In another embodiment of the invention, the dielectric filling material is an oxide.

The memory cell arrangement may further include a first bit line coupled to the electrically conductive filling material that is coupled to the source/drain region of the transistor of the plurality of transistors of the first memory cell string and a second bit line coupled to the electrically conductive filling material that is coupled to the source/drain region of the transistor of the plurality of transistors of the second memory cell string.

The first bit line and the second bit line may be made of a metal, wherein the metal may have a resistivity of less than 10 $\mu\Omega$cm, e.g., a resistivity of less than or equal to 6 $\mu\Omega$cm, and e.g., a resistivity of less than or equal to 5 $\mu\Omega$cm. The metal may include, be made of, or may consist of a metal being selected from a group consisting of copper, aluminum, silver, and gold.

In an embodiment of the invention, the memory cell arrangement further includes a source line coupled to the electrically conductive filling material that is coupled to the source/drain region of the transistor of the plurality of transistors of the first memory cell string.

In an embodiment of the invention, the memory cell arrangement further includes, in addition to the source/drain line groove, a further source/drain line groove in the dielectric material, the source/drain line groove extends from a source/drain region of a further transistor of the plurality of transistors of the first memory cell string to a source/drain region of a further transistor of the plurality of transistors of the second memory cell string. Furthermore, further electrically conductive filling material is provided in the further source/drain line groove coupled to the source/drain region of the further transistor of the plurality of transistors of the first memory cell string and to the source/drain region of the further transistor of the plurality of transistors of the second memory cell string. A source line is coupled to the further electrically conductive filling material.

The further electrically conductive filling material may be made of the same material as the electrically conductive filling material.

The source line may be made of the same material as the first bit line and the second bit line.

In another embodiment of the invention, a memory cell arrangement is provided that includes a plurality of memory cells, each memory cell comprising a first source/drain region, a second source/drain region, an active region between the first source/drain region and the second source/drain region, and a gate region and bit lines coupled to the first source/drain regions or the second source/drain regions of the memory cells, the bit lines being made of a metal having a resistivity of less than 10 $\mu\Omega$cm.

The bit line metal may have a resistivity of less than or equal to 6 $\mu\Omega$cm, e.g., a resistivity of less than or equal to 5 $\mu\Omega$cm. The bit line metal may include a metal selected from a group consisting of copper, aluminum, silver, and gold.

In another embodiment of the invention, a method of manufacturing a memory cell arrangement is provided that includes forming a first memory cell string comprising a plurality of serially source-to-drain-coupled transistors, at least some of them being memory cells, forming a second memory cell string comprising a plurality of serially source-to-drain-coupled transistors, at least some of them being memory cells, forming dielectric material between and above the plurality of transistors of the first memory cell string and the plurality of transistors of the second memory cell string, forming a source/drain line groove in the dielectric material, the source/drain line groove extending from a source/drain region of one transistor of the plurality of transistors of the first memory cell string to a source/drain region of one transistor of the plurality of transistors of the second memory cell string, at least partially filling electrically conductive filling material into the source/drain line groove coupling to the source/drain region of the transistor of the plurality of transistors of the first memory cell string and to the source/drain region of the transistor of the plurality of transistors of the second memory cell string, removing the electrically conductive filling material in a region between the transistor of the plurality of transistors of the first memory cell string and the source/drain region of the transistor of the plurality of transistors of the second memory cell string, and at least partially filling dielectric filling material into the source/drain line groove in those regions, in which the electrically conductive filling material has been removed.

Non-volatile memory cells may be formed in the first memory cell string and/or the second memory cell string.

Furthermore, a first bit line may be formed coupled to the electrically conductive filling material that is coupled to the source/drain region of the transistor of the plurality of transistors of the first memory cell string, and a second bit line may be formed coupled to the electrically conductive filling material that is coupled to the source/drain region of the transistor of the plurality of transistors of the second memory cell string.

The first bit line and the second bit line may be made of a metal having a resistivity of less than 10 μΩcm. The metal may include a metal selected from a group consisting of copper, aluminum, silver, and gold.

Furthermore, the electrically conductive filling material may be removed using a line mask.

A further source/drain line groove may be formed in the dielectric material, the source/drain line groove extending from a source/drain region of a further transistor of the plurality of transistors of the first memory cell string to a source/drain region of a further transistor of the plurality of transistors of the second memory cell string. Furthermore, further electrically conductive filling material may be formed in the further source/drain line groove coupled to the source/drain region of the further transistor of the plurality of transistors of the first memory cell string and to the source/drain region of the further transistor of the plurality of transistors of the second memory cell string, and a source line may be formed coupled to the further electrically conductive filling material.

The forming the source/drain line groove and the forming the further source/drain line groove may be carried out in a common process, e.g., simultaneously.

In another embodiment of the invention, a method of manufacturing a memory cell arrangement is provided. The method includes forming a plurality of memory cells, each memory cell comprising a first source/drain region, a second source/drain region, an active region between the first source/drain region and the second source/drain region, and a gate region and forming bit lines coupled to the first source/drain regions or the second source/drain regions of the memory cells, the bit lines being made of a metal having a resistivity of less than 10 μΩcm.

The foregoing description has been presented for purposes of illustration and description. It is not intended to be exhaustive or to limit the invention to the precise form disclosed, and obviously many modifications and variations are possible in light of the disclosed teaching. The described embodiments were chosen in order to best explain the principles of the invention and its practical application to thereby enable others skilled in the art to best utilize the invention in various embodiments and with various modifications as are suited to the particular use contemplated. It is intended that the scope of the invention be defined by the claims appended hereto.

What is claimed is:

1. A memory cell arrangement, comprising:
   a first memory cell string comprising a plurality of serially source-to-drain-coupled transistors, at least some of the transistors being memory cells;
   a second memory cell string comprising a plurality of serially source-to-drain-coupled transistors, at least some of the transistors being memory cells;
   dielectric material between and above the plurality of transistors of the first memory cell string and the plurality of transistors of the second memory cell string;
   a source/drain line groove in the dielectric material, the source/drain line groove extending from a source/drain region of one transistor of the plurality of transistors of the first memory cell string to a source/drain region of one transistor of the plurality of transistors of the second memory cell string;
   electrically conductive filling material in the source/drain line groove coupled to the source/drain region of the transistor of the plurality of transistors of the first memory cell string and to the source/drain region of the transistor of the plurality of transistors of the second memory cell string; and
   dielectric filling material in the source/drain line groove between the source/drain region of the transistor of the plurality of transistors of the first memory cell string and the source/drain region of the transistor of the plurality of transistors of the second memory cell string.

2. The memory cell arrangement of claim 1, wherein the first memory cell string comprises a NAND memory cell string.

3. The memory cell arrangement of claim 2, wherein the second memory cell string comprises a NAND memory cell string.

4. The memory cell arrangement of claim 1, wherein the transistor of the plurality of transistors of the first memory cell string comprises a select transistor selecting the memory cells of the first memory cell string.

5. The memory cell arrangement of claim 4, wherein the transistor of the plurality of transistors of the second memory cell string comprises a select transistor selecting the memory cells of the second memory cell string.

6. The memory cell arrangement of claim 1, wherein the transistor of the plurality of transistors of the first memory cell string comprises a memory cell of the first memory cell string.

7. The memory cell arrangement of claim 6, wherein the transistor of the plurality of transistors of the second memory cell string comprises a memory cell of the second memory cell string.

8. The memory cell arrangement of claim 6, wherein the memory cells comprise non-volatile memory cells.

9. The memory cell arrangement of claim 8, wherein the non-volatile memory cells comprise floating gate memory cells.

10. The memory cell arrangement of claim 8, wherein the non-volatile memory cells comprise charge trapping memory cells.

11. The memory cell arrangement of claim 1, wherein the memory cells comprise non-volatile memory cells.

12. The memory cell arrangement of claim 11, wherein the non-volatile memory cells comprise floating gate memory cells.

13. The memory cell arrangement of claim 11, wherein the non-volatile memory cells comprise charge trapping memory cells.

14. The memory cell arrangement of claim 1, wherein the electrically conductive filling material comprises a metal.

15. The memory cell arrangement of claim 14, wherein the metal comprises a material selected from the group consisting of titanium, titanium and nitride, or tungsten.

16. The memory cell arrangement of claim 1, wherein the dielectric filling material comprises an oxide.

17. The memory cell arrangement of claim 1, further comprising:
a first bit line coupled to the electrically conductive filling material that is coupled to the source/drain region of the transistor of the plurality of transistors of the first memory cell string; and
a second bit line coupled to the electrically conductive filling material that is coupled to the source/drain region of the transistor of the plurality of transistors of the second memory cell string.

18. The memory cell arrangement of claim 17, wherein the first bit line and the second bit line are made of a metal.

19. The memory cell arrangement of claim 17, further comprising
a further source/drain line groove in the dielectric material, the source/drain line groove extending from a source/drain region of a further transistor of the plurality of transistors of the first memory cell string to a source/drain region of a further transistor of the plurality of transistors of the second memory cell string;
further electrically conductive filling material in the further source/drain line groove coupled to the source/drain region of the further transistor of the plurality of transistors of the first memory cell string and to the source/drain region of the further transistor of the plurality of transistors of the second memory cell string; and
a source line coupled to the further electrically conductive filling material.

20. The memory cell arrangement of claim 19, wherein the further electrically conductive filling material is made of the same material as the electrically conductive filling material.

21. The memory cell arrangement of claim 17, wherein a source line is made of the same material as the first bit line and the second bit line.

22. The memory cell arrangement of claim 18, wherein the metal has a resistivity of less than about 10 $\mu\Omega$cm.

23. The memory cell arrangement of claim 18, wherein the metal comprises a metal selected from the group consisting of copper, aluminum, silver, and gold.

24. The memory cell arrangement of claim 22, wherein the metal has a resistivity of less than or equal to 6 $\mu\Omega$cm.

25. The memory cell arrangement of claim 24, wherein the metal has a resistivity of less than or equal to 5 $\mu\Omega$cm.

26. The memory cell arrangement of claim 1, further comprising a source line coupled to the electrically conductive filling material that is coupled to the source/drain region of the transistor of the plurality of transistors of the first memory cell string.

* * * * *